(12) United States Patent
Chen et al.

(10) Patent No.: US 7,292,098 B2
(45) Date of Patent: Nov. 6, 2007

(54) OPERATIONAL AMPLIFIER

(75) Inventors: Lei Chen, Loveland, CO (US);
Richard Kok Keong Lum, Loveland, CO (US)

(73) Assignee: Avago Technologies ECBU IP (Singapore) Pte Ltd

( * ) Notice: Subject to any disclaimer, the term of this patent is extended or adjusted under 35 U.S.C. 154(b) by 139 days.

(21) Appl. No.: 11/267,422

(22) Filed: Nov. 4, 2005

(65) Prior Publication Data
US 2007/0103232 A1 May 10, 2007

(51) Int. Cl.
*H03F 3/52* (2006.01)

(52) U.S. Cl. .................. 330/109; 330/294

(58) Field of Classification Search .......... 330/109, 330/294, 310, 98, 150
See application file for complete search history.

(56) References Cited

U.S. PATENT DOCUMENTS

| | | | |
|---|---|---|---|
| 5,212,455 A | 5/1993 | Pernici et al. | |
| 5,486,790 A * | 1/1996 | Huijsing et al. | 330/260 |
| 6,208,206 B1 * | 3/2001 | Leung et al. | 330/107 |
| 6,573,790 B2 * | 6/2003 | Steensgaard-Madsen | 330/107 |
| 6,573,791 B2 * | 6/2003 | Sridhar | 330/109 |

OTHER PUBLICATIONS

"Multistage Amplifier Topologies with Nested Gm-C Compensation," Fan You et al., IEEE Journal of Solid-State Circuits, vol. 32, No. 12, Dec. 1997, pp. 2000 to 2011.

"Low-Power Low-Voltage VLSI Operational Amplifier Cells," Johan H. Huijsing, et al., IEEE Transactions on Circuits and Systems—I: Fundamental Theory and Applications, vol. 42, No. 11, Nov. 1995, pp. 841 to 852.

* cited by examiner

*Primary Examiner*—Henry Choe

(57) ABSTRACT

An operational amplifier is described. The operational amplifier includes a first stage, a second stage, a third stage, and a fourth stage. The amplifier includes a nested transconductance-capacitance compensation configuration. The third stage includes class AB control mechanism. The fourth stage includes a class AB output stage.

20 Claims, 4 Drawing Sheets

OPERATIONAL AMPLIFIER

BACKGROUND OF THE INVENTION

The operation amplifiers are useful in many different analog applications. For example, operational amplifiers are commonly found and utilized in communication systems. One application that requires operation amplifiers is a power line communications system. In such systems, the typical resistive loading is about a few ohms.

In this environment, ordinary operational amplifiers are insufficient because prior art amplifiers do not provide sufficient drive current. Unfortunately, if a heavy resistive load is applied to this amplifier, the output stage current will be insufficient to drive the load unless the biasing current of the output stage is set at an unreasonable level. For example, prior art operational amplifiers that use a class A output is not suitable for driving the type of resistive load encountered in power line communication systems.

Furthermore, in the design of multi-stage operational amplifiers instability and signal distortion are always of concern to the designer. In power line communication systems, stability issues are of even greater concern because the power line impedance changes with time and can become very low sometimes. Prior art operation amplifiers often exhibit an undesirable AC response, which can cause the amplifier to become unstable during operation. Large signal distortion is undesirable because the distortion prohibits the effective and efficient transmission of signals.

An example of an approach is described in U.S. Pat. No. 5,212,455, Pernici et al., "Differential Output, Power, CMOS, Operational Amplifier," May 18, 1993. Unfortunately, the implementation has large distortions due to its unbalanced gains in the PMOS path and the NMOS path. For example, the total effective gain in the PMOS path is the product of the gains for the first stage, the second stage, and the third stage, whereas the total effective gain in the NMOS path is only the product of the gains of the first stage and the third stage.

Based on the foregoing, there remains a need for an operational amplifier that overcomes the disadvantages set forth previously.

SUMMARY OF THE INVENTION

According to one embodiment of the present invention, a high linearity, high drivability four-stage operational amplifier is described. The operational amplifier includes a first stage, a second stage, a third stage, and a fourth stage. The amplifier includes a nested transconductance-capacitance compensation configuration. The third stage includes class AB control mechanism. The fourth stage includes a class AB output stage.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

An operational amplifier with improved stability and drive capability is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Operational Amplifier (Op Amp) 10

Figure 1:
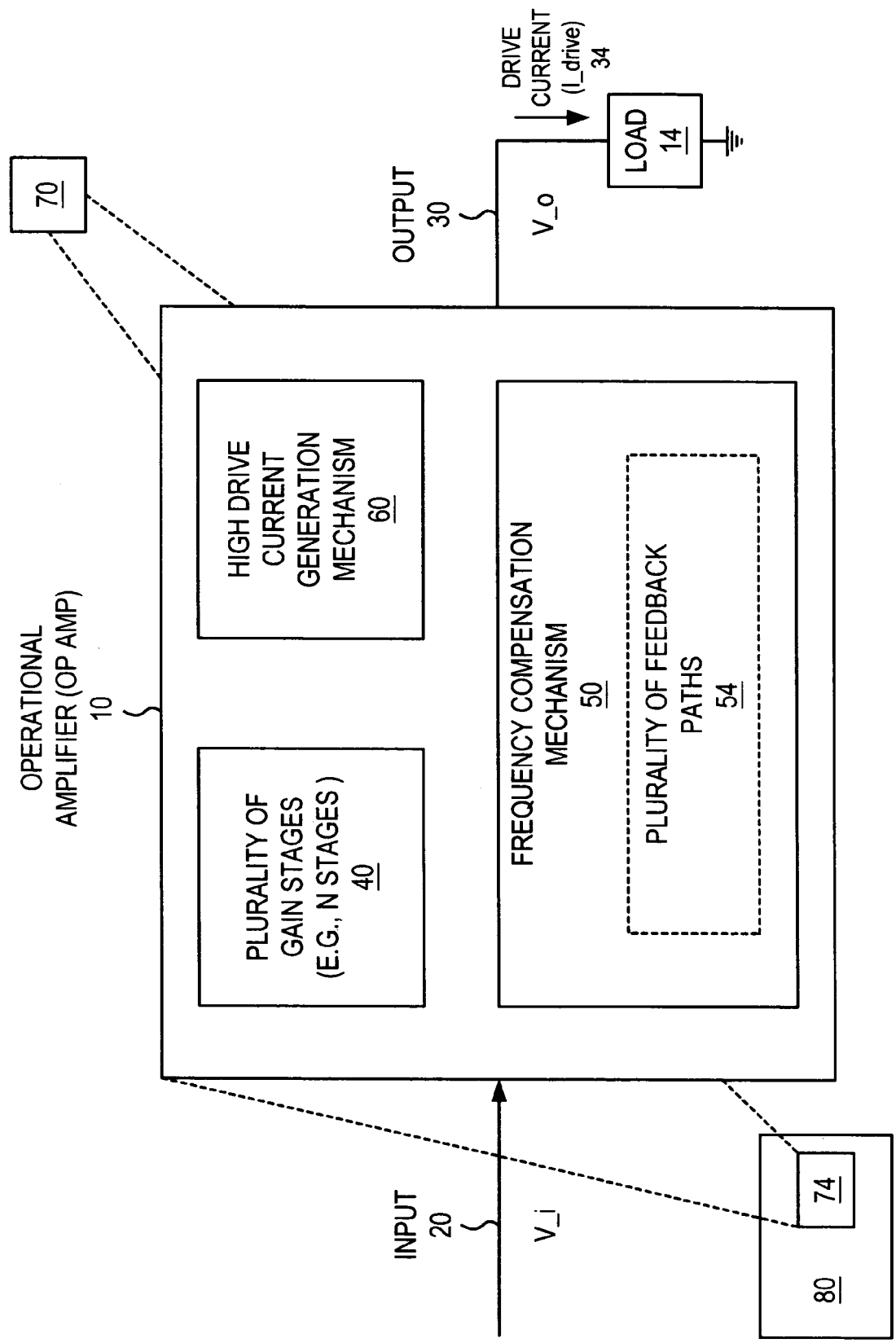
FIG. 1 illustrates an operational amplifier according to one embodiment of the invention.

FIG. 1 illustrates an operational amplifier 10 according to one embodiment of the invention. The operational amplifier 10 (op amp) includes an input 20 that receives an input signal (e.g., an input voltage signal, V_i) and an output 30 that generates an output signal (e.g., an output voltage, V_o). The operational amplifier 10 also generates a drive current (I_drive) 34. The amplifier 10 can drive a load 14 (e.g., a resistive load or a capacitive load) that is coupled to the output 30.

The operational amplifier 10 also includes a plurality of amplification stages 40 (e.g., N stages), a frequency compensation mechanism 50, and a drive current enhancement mechanism 60. The operational amplifier 10 can be a multistage operational amplifier (op amp) that includes N stages (e.g., an N-stage op amp).

The frequency compensation mechanism 50 reduces the signal distortion generated by the amplifier 10 and improves stability of the operational amplifier 10. In one embodiment, the frequency compensation mechanism 50 includes a plurality of feedback paths 54 that provide multiple signal paths for the signal as it travels from the input 20 to the output 30. For example, the frequency compensation mechanism 50 can include a nested compensation structure (e.g., a nested Miller compensation configuration or a nested transconductance-capacitance compensation configuration) to improve the stability of the operational amplifier 10 as described in greater detail hereinafter with reference to FIG. 2.

The drive current enhancement generation mechanism 60 provides an output current that is capable of driving resistive loads in the range of about 2 ohms to about 3 ohms. In some applications, the drive current enhancement mechanism 60 generates a drive current (I_drive) 34 is the range of about 0.5 A to about 1 A.

In one embodiment, the operational amplifier according to the invention utilizes a class AB output stage (also referred to as a push-pull output stage) to provide high drivability at a relatively low quiescent bias current. In one embodiment, the operational amplifier according to the invention generates a 1 A current drive at a quiescent bias current is in the range of about 10 mA to about 20 mA.

As described in greater detail hereinafter with reference to FIG. 2, the drive current enhancement mechanism 60 may be implemented as an output stage with high drive capability (e.g., an AB output stage) according to one embodiment of the invention.

It is noted that the operational amplifier 10 can be implemented as an integrated circuit 70 (e.g., a driver IC). In another embodiment the operational amplifier 10 may be integrated into another circuit 74, such as a transmitter circuit. Alternatively, in another embodiment the operational amplifier 10 is utilized in a system 80 (e.g., a powerline modem (PLM)) as a separate component or integrated with another component of the system.

Four Stage Operational Amplifier

Figure 2:
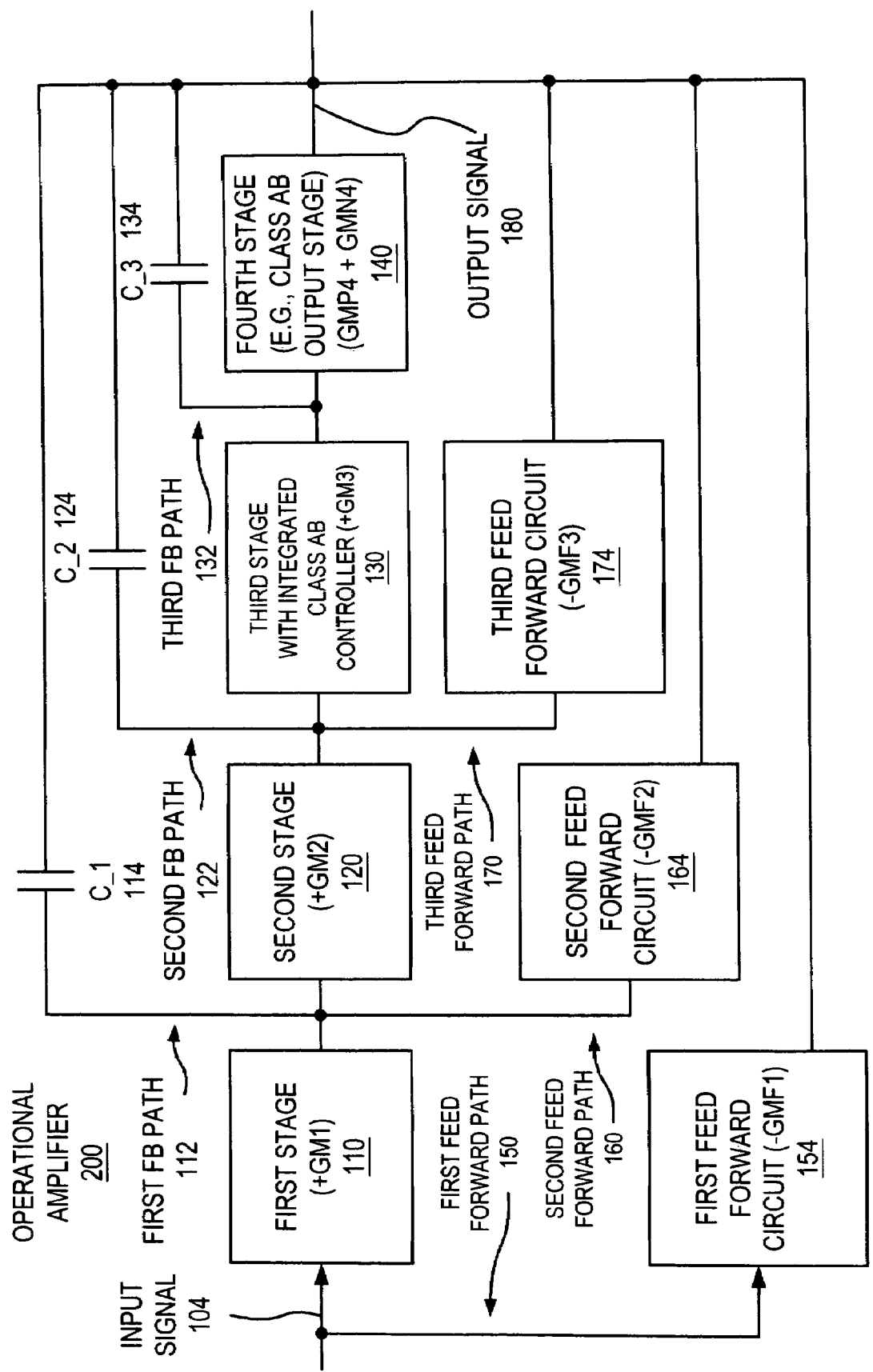
FIG. 2 is a block diagram that illustrates in greater detail an exemplary implementation of the operational amplifier of FIG. 1 that includes four stages.

FIG. 2 is a block diagram that illustrates in greater detail an exemplary implementation 200 of the operational amplifier 10 of FIG. 1 that includes four stages. The operational amplifier 10 includes a first stage 110, a second stage 120, a third stage 130, and a fourth stage 140.

The operational amplifier 10 includes a plurality of feedback paths (e.g., a first feedback path 112, a second feedback path 122, and a third feedback path 132). The first feedback path 112 includes a first compensation capacitor 114 (C_1). The second feedback path 122 includes a second compensation capacitor 124 (C_2). The third feedback path 132 includes a third compensation capacitor 134 (C_3).

The operational amplifier 10 also includes a plurality of feed forward paths (e.g., a first feed forward path 150, a second feed forward path 160, and a third feed forward path 170). The first feed forward path 150 includes a first feed forward circuit 154, which in one embodiment is a negative feed forward stage (denoted by –Gmf1). The second feed forward path 160 includes a second feed forward circuit 164, which in one embodiment is a negative feed forward stage (denoted by –Gmf2). The third feed forward path 170 includes a third feed forward circuit 174, which in one embodiment is a negative feed forward stage (denoted by –Gmf3).

The gain stages, feedback paths, and feed forward paths are configured to realize a nested frequency compensation structure. For example, the nested frequency compensation structure can include a nested Miller compensation structure or a nested transconductance-capacitance compensation configuration as shown in FIG. 2. The nested transconductance-capacitance compensation configuration includes an inner loop that includes third stage 130, fourth stage 140, the third feed forward circuit 174, and the third feedback path 132.

The nested transconductance-capacitance compensation configuration also includes an intermediate loop that includes second stage 120, all the components in the inner loop, the second feed forward circuit 164, and the second feedback path 122. The nested transconductance-capacitance compensation configuration also includes an outer loop that includes first stage 110, all the components in the intermediate loop, the first feed forward circuit 154, and first feedback path 112. The nested transconductance-capacitance compensation configuration stabilizes the amplifier 100 and reduces signal distortion.

In one embodiment, the gain stages of the amplifier 100 are noncascode low gain stages. One advantage of the nested transconductance-capacitance compensation topology according to the invention over the nested Miller compensation multistage amplifier is enhanced bandwidth. The amplifier 100 includes one or more feed forward stages 154, 164, and 174 that are used to improve the performance of the amplifier 100.

The operational amplifier includes a NMOS path that couples the input to the output and a PMOS path that couples the input to the output. In one embodiment, the operational amplifier according to the invention reduces signal distortions by utilizing an equal number of gain stages in both the NMOS path and PMOS path. For example, the design of the operational amplifier can be configured so that the total gain in the PMOS path is balanced with the total gain in the NMOS path. By balancing the gains in the NMOS path and the NMOS path, the operational amplifier achieves a reduced distortion of harmonics.

Exemplary Circuit Implementation of Operational Amplifier 10

Figure 3:
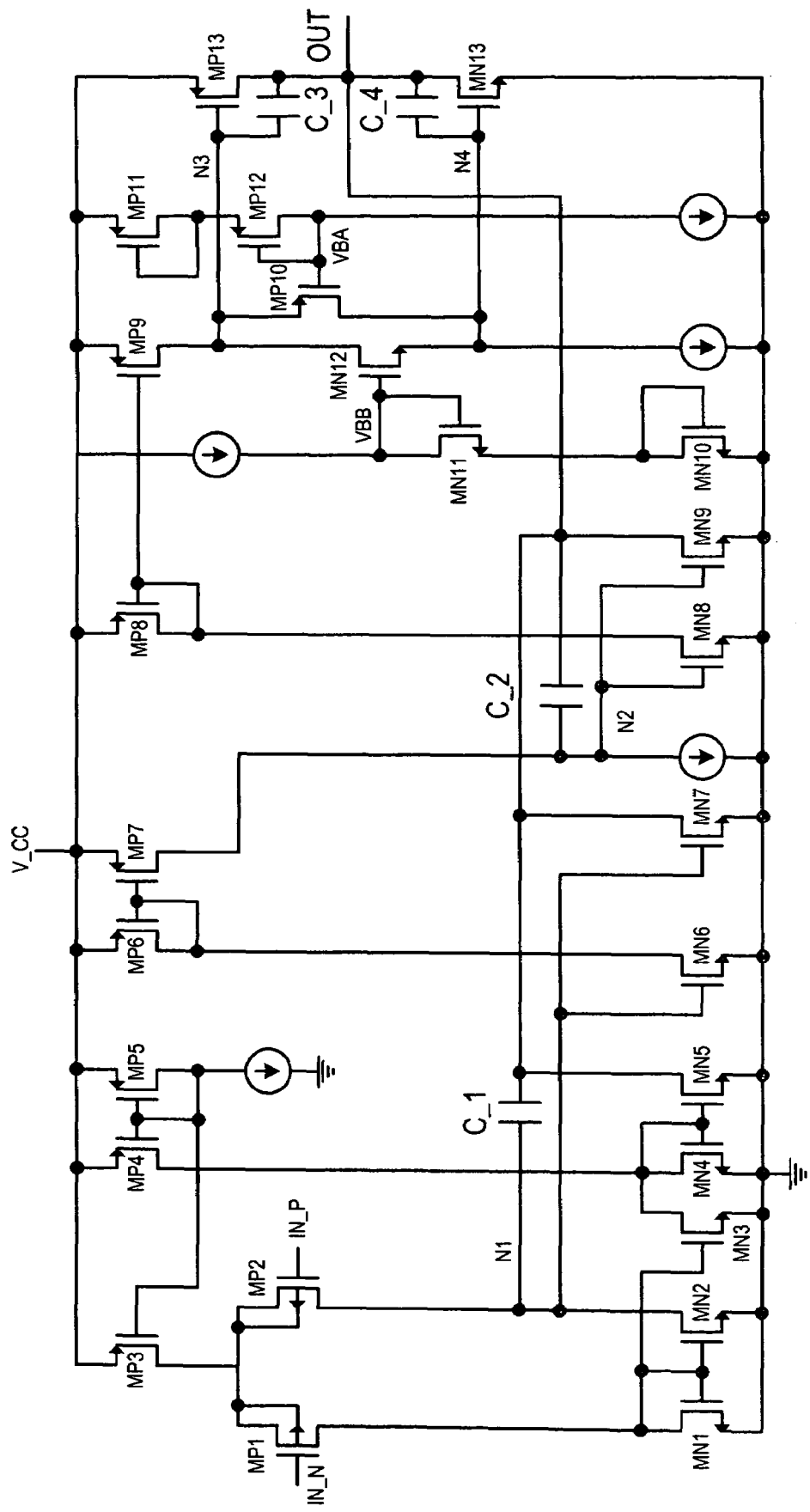
FIG. 3 illustrates a circuit level implementation of the operational amplifier of FIG. 2 according to one embodiment of the invention.

FIG. 3 illustrates a circuit level implementation 300 of the operational amplifier 200 of FIG. 2 according to one embodiment of the invention. The first gain stage 110, which in one embodiment is a non-inverting gain stage (+Gm1), may be implemented with transistor MP1 and transistor MP2 that form a differential pair. The differential pair receives the input signals, Inn and Inp, respectively. Transistors MN1 and MN2 form a current mirror loading to the differential pair input stage. The first feed forward stage (–Gmf1) includes transistors MN3, MN4 and MN5 that form a current mirror (with phase negation) with transistor MN1.

The second gain stage (+Gm2), which in one embodiment is a non-inverting gain stage, includes transistor MN6. A PMOS current mirror that includes transistor MP6 and transistor MP7 provides phase negation. The second feed forward stage (–Gmf2) is implemented with transistor MN7.

At node n2, the third gain stage (+Gm3), which in one embodiment is a non-inverting gain stage, is formed by transistor MN8, transistor MP8, and transistor MP9. The third feed forward stage (–Gmf3) is implemented with transistor MN9. The class AB output stage control circuit is formed by transistor MPIO, transistor MN12 and biasing circuitry described hereinbelow. The class AB output controller controls and biases the AB output stage (e.g., the Gmp4 and Gmn4 blocks). The output stage (Gmp4 and Gmn4) can be realized by transistor MP13 and transistor MN13, respectively. It is noted that capacitors (e.g., C1, C2, C3, and C4) are provided for compensation purposes.

When a differential signal is applied across input nodes (IN_n and IN_p), transistors MP1 & MP2, along with the current mirror load formed by MN1 & MN2, amplify the input signal. The amplified signal at node n1 is then amplified by the second gain stage MN6. Transistors MP6 & MP7 provide a phase negation in this stage.

The output of the second stage at node n2 is again amplified by transistor MN8, which is the third gain stage. Transistors MP8 & MP9 provides the phase negation for the third stage. The signals at nodes n3 and n4, respectively, are the output of the third stage. The signals at nodes n3 and n4 are in-phase, but at different DC levels in order to properly bias the last stage, which includes transistor MN13 and transistor MP13. In this embodiment, the last stage is formed by transistor MN13 and transistor MP13. The last stage, not only provides gain, but also provides enough drivability to drive a very heavy load.

Signals, V_ba & V_bb, are provided as proper biasing voltages for the class AB control circuit formed by transistor MN12 and transistor MP10. Transistors MN10 & MN11 and transistors MP10 & MP11 provide a biasing signal (e.g., a biasing voltage) for the class AB control circuit. Transistors MP3, MP4 and MP5 are current mirrors that provide proper biasing for the circuit.

It is noted that in one embodiment, the operational amplifier according to the invention is implemented in a line driver integrated circuit, such as the Agilent HCPL-8100/0810 High Current Line Driver, which is available from the assignee of the invention. It is further noted that in another embodiment, the operational amplifier according to the invention is integrated into a transmitter, transceiver, or modem, such as a powerline modem.

Figure 4:
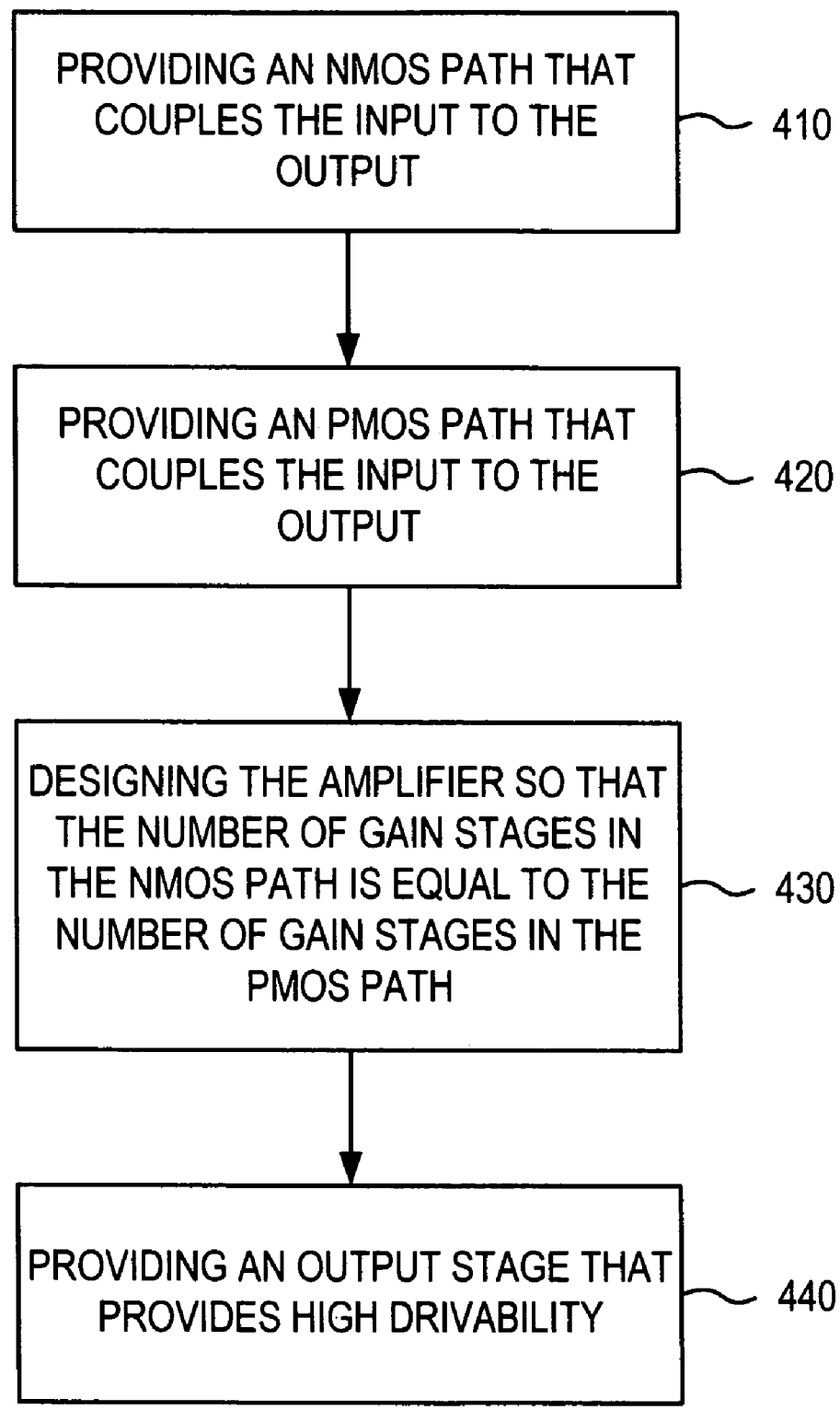
FIG. 4 is a flowchart illustrating a method for designing an operational amplifier according to a one embodiment of the invention.

FIG. 4 is a flowchart illustrating a method for designing an operational amplifier according to a one embodiment of the invention. In step 410, an NMOS path is provided in the operational amplifier. The NMOS path couples the input of the amplifier to the output of the amplifier. In step 420, a PMOS path is provided in the operational amplifier. The PMOS path couples the input of the amplifier to the output of the amplifier. In step 430, the amplifier is designed so that the number of gain stages in the NMOS path is equal to the number of gain stages in the PMOS path. In step 440, an output stage (e.g., an AB class output stage) is provided that provides high drivability, which in one embodiment is defined as a drive current in the range of about 0.5 A to about 1 A with a bias current of about 10 mA to about 20 mA for a load in the range of about 1 to 5 about ohms.

The operational amplifier according to the invention can be utilized in applications that include, but are not limited to, powerline modems, general purpose line drivers, signal conditioning circuits, and digital to analog converter buffers.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. An operational amplifier comprising:
   an amplifier input for receiving an input signal;
   a first stage that includes a first stage input coupled to the amplifier input and a first stage output;
   a second stage that includes a second stage input coupled to the first stage output and a second stage output;
   a third stage that includes a third stage input coupled to the second stage output, a controller, a first controller bias circuit, a second controller bias circuit and first and second third stage outputs; and
   a class AB output stage that includes first and second nodes for receiving the respective first and second third stage outputs and an amplifier output, the first and second outputs from the third stage being in-phase and at different levels, wherein the first stage, second stage, third stage and class AB output stage are configured in a nested compensation structure.

2. The amplifier of claim 1 wherein the nested compensation structure includes a plurality of feed forward paths.

3. The amplifier of claim 2 wherein the plurality of feed forward paths includes
   a first feed forward path coupled to the amplifier input and the amplifier output;
   a second feed forward path coupled to the second stage input and the amplifier output; and
   a third feed forward path coupled to the third stage input and the amplifier output.

4. The amplifier of claim 3 wherein the first feed forward path includes a first feed forward transconductance stage.

5. The amplifier of claim 3 wherein the second feed forward path includes a second feed forward transconductance stage.

6. The amplifier of claim 3 wherein the third feed forward path includes a third feed forward transconductance stage.

7. The amplifier of claim 1 wherein the nested compensation structure includes a plurality of feedback paths.

8. The amplifier of claim 7 wherein the plurality of feedback paths includes
   a first feedback path coupled to the second stage input and the amplifier output;
   a second feedback path coupled to the third stage input and the amplifier output; and
   a third feedback path coupled to the class AB output stage and the amplifier output.

9. The amplifier of claim 8 wherein the first feedback path includes a first compensation capacitor.

10. The amplifier of claim 8 wherein the second feedback path includes a second compensation capacitor.

11. The amplifier of claim 8 wherein the third feedback path includes a third compensation capacitor.

12. The amplifier of claim 1 wherein the first stage includes a differential amplification stage that receives a differential input and generates a single ended output.

13. The amplifier of claim 1 wherein the second stage includes a single field effect transistor (FET).

14. An operational amplifier comprising:
    an amplifier input;
    an amplifier output; and
    a plurality of stages interposed between the amplifier input and the amplifier output, the plurality of stages configured in a frequency compensation structure that improves the stability of the operational amplifier, the plurality of stages including a class AB output stage and a class AB controller that is integrated in one of the stages, the class AB controller configured to generate first and second outputs being in-phase and at different levels to bias the AB output stage.

15. The amplifier of claim 14 wherein the frequency compensation structure includes a plurality of feed forward paths.

16. The amplifier of claim 15 wherein the plurality of feed forward paths includes
    a first feed forward path coupled to the amplifier input and the amplifier output;
    a second feed forward path coupled to the a second stage input and the amplifier output; and
    a third feed forward path coupled to a third stage input and the amplifier output.

17. The amplifier of claim 16 wherein the first feed forward path includes a first feed forward transconductance stage; wherein the second feed forward path includes a second feed forward transconductance stage; and wherein the third feed forward path includes a third feed forward transconductance stage.

18. The amplifier of claim 14 wherein the frequency compensation structure includes a plurality of feedback paths.

19. The amplifier of claim 18 wherein the plurality of feedback paths includes
    a first feedback path coupled to a second stage input and the amplifier output;
    a second feedback path coupled to a third stage input and the amplifier output; and
    a third feedback path coupled to the class AB output stage and the amplifier output.

20. The amplifier of claim 19 wherein the first feedback path includes a first compensation capacitor; wherein the second feedback path includes a second compensation capacitor; and wherein the third feedback path includes a third compensation capacitor.

* * * * *

UNITED STATES PATENT AND TRADEMARK OFFICE
CERTIFICATE OF CORRECTION

| | | |
|---|---|---|
| PATENT NO. | : 7,292,098 B2 | Page 1 of 1 |
| APPLICATION NO. | : 11/267422 | |
| DATED | : November 6, 2007 | |
| INVENTOR(S) | : Lei Chen et al. | |

It is certified that error appears in the above-identified patent and that said Letters Patent is hereby corrected as shown below:

Column 6, Line 37 (approx.), Claim 16, after "to" delete "the".

Signed and Sealed this

Eighth Day of June, 2010

David J. Kappos
*Director of the United States Patent and Trademark Office*